(12) United States Patent
Theppakuttai et al.

(10) Patent No.: US 8,299,394 B2
(45) Date of Patent: Oct. 30, 2012

(54) APPROACH FOR ASSEMBLING AND REPAIRING PROBE ASSEMBLIES USING LASER WELDING

(75) Inventors: Senthil Theppakuttai, Scottsdale, AZ (US); Peter J. Klaerner, Gilbert, AZ (US); Jason Bradach, Phoenix, AZ (US); Mark Cunningham, Queen Creek, AZ (US); Bahadir Tunaboylu, Chandler, AZ (US)

(73) Assignee: SV Probe Pte Ltd., Singapore (SG)

( * ) Notice: Subject to any disclaimer, the term of this patent is extended or adjusted under 35 U.S.C. 154(b) by 147 days.

(21) Appl. No.: 11/818,851

(22) Filed: Jun. 15, 2007

(65) Prior Publication Data

US 2008/0308536 A1 Dec. 18, 2008

(51) Int. Cl.
*B23K 26/00* (2006.01)

(52) U.S. Cl. ......... 219/121.64; 219/121.63; 219/121.67; 219/121.69

(58) Field of Classification Search ............ 219/121.12, 219/121.29, 121.33, 121.6, 121.78; 29/846, 29/847, 402.01, 402.03, 402.06, 40.08, 402.13; 324/754
See application file for complete search history.

(56) References Cited

U.S. PATENT DOCUMENTS

| 5,421,506 A * | 6/1995 | Kooijman et al. ............ 228/103 |
| 6,019,599 A * | 2/2000 | Volcker et al. ................. 433/29 |
| 2001/0044167 A1 * | 11/2001 | Kuo ............................... 438/106 |
| 2003/0113990 A1 * | 6/2003 | Grube et al. ................... 438/612 |
| 2003/0153134 A1 * | 8/2003 | Kawata et al. ................. 438/123 |
| 2006/0255019 A1 * | 11/2006 | Martukanitz et al. .... 219/121.64 |

FOREIGN PATENT DOCUMENTS

| JP | 05-136557 | * | 6/1993 |
| JP | 08-017985 | * | 1/1996 |
| KR | 2006-0097435 | * | 9/2006 |
| WO | WO 2004056685 A1 * | 7/2004 |

* cited by examiner

*Primary Examiner* — Henry Yuen
*Assistant Examiner* — Thien S Tran
(74) *Attorney, Agent, or Firm* — Hickman Palermo Truong Becker Bingham Wong LLP; Edward A. Becker

(57) ABSTRACT

An approach for assembling and repairing probe assemblies using laser welding includes aligning a beam element to a post element on a probe substrate. The beam element is positioned in contact with the post element on the probe substrate. The beam element is then attached to the post element on the probe substrate by laser welding the beam element to the post element on the probe substrate. The approach may include the use of a vacuum capillary pickup tool to align and position the beam element. The vacuum capillary pickup tool may also operate in conjunction with a laser beam delivery system for guiding the laser beam to the correct location for welding and also to assist in removing gases and debris attributable to the laser welding process. The approach allows probe elements to be connected directly to a probe substrate without requiring an intermediate layer.

6 Claims, 4 Drawing Sheets

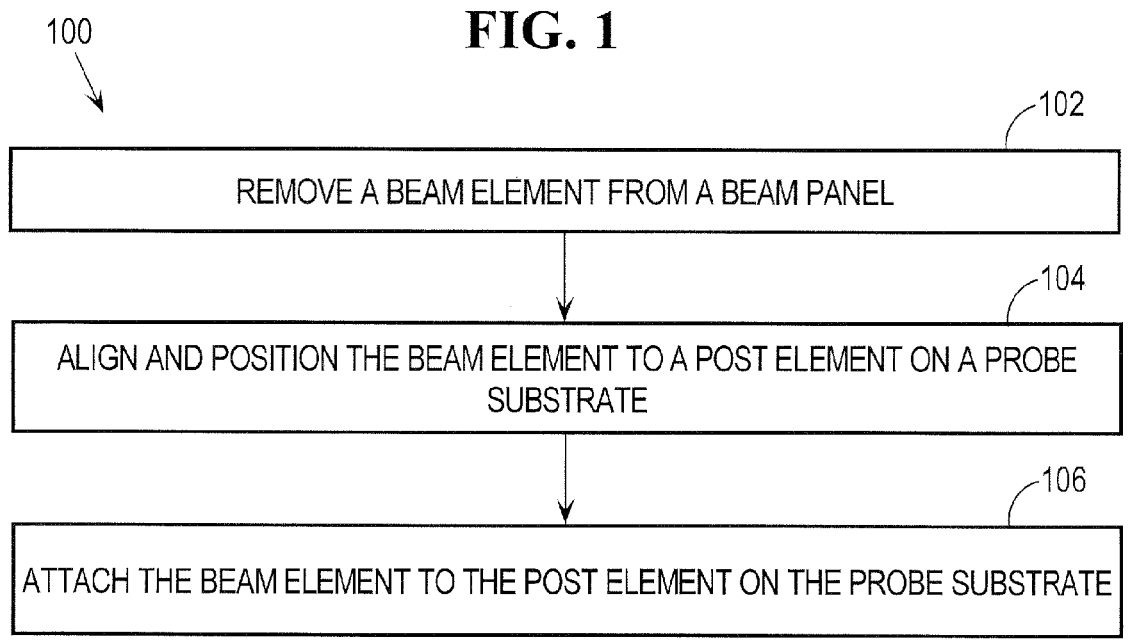
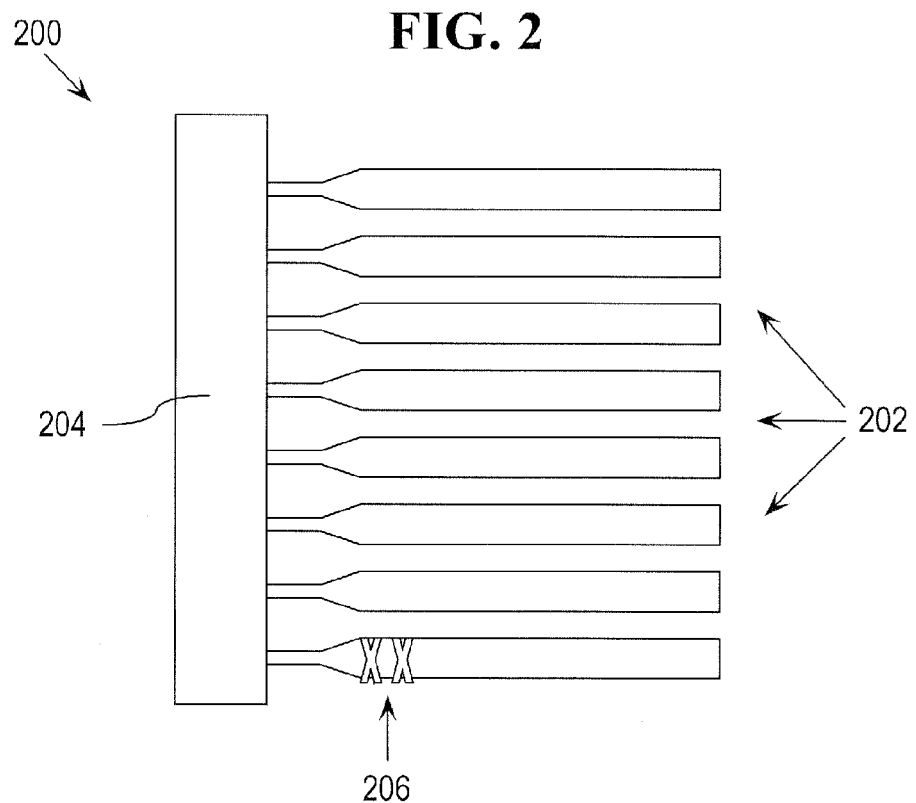

APPROACH FOR ASSEMBLING AND REPAIRING PROBE ASSEMBLIES USING LASER WELDING

FIELD OF THE INVENTION

This invention relates generally to probe assemblies used in the testing of wafer-based semiconductor devices.

BACKGROUND

In the testing of wafer-based semiconductor devices, probe cards are typically used to provide electrical interconnection between a testing system and the semiconductor wafer. Such probe cards may, for example, include a Printed Circuit Board (PCB), a probe substrate and an interposer (e.g., a pogo pin or spring pin based interposer) that provides electrical interconnection between the PCB and the probe substrate. Resilient probe elements are supported by the probe substrate. For example, in certain probe cards, the probe elements may be held in a "floating" configuration within a probe head adjacent the probe substrate. In other probe cards, the probe elements may be fixed at one end to a conductive region (e.g., a conductive trace, a terminal, a lead, a contact pad, etc.) of the probe substrate.

The probe elements may have different configurations depending upon the testing application. For example, cantilever style probes are sometimes used in the testing of memory devices. Cantilever probes typically include beam element mounted to a post element located adjacent a conductive region on a probe substrate. The beam element is mounted to the post element at one end of the beam so that the other end of the beam is suspended in a cantilever configuration. The suspended end of the beam element includes a tip portion that is configured to probe a contact pad or other feature of the semiconductor device being tested.

Probe elements are conventionally attached to a probe substrate by, for example, epoxy bonding, solder reflowing, or TAB bonding. These conventional approaches have some limitations. For example, TAB bonding requires a gold intermediate layer between the probes and the probe substrate, or between the beam element and the post element for cantilever probes. The strength of a TAB bond is relatively weak, any repair or adjustment can lead to the detachment of probes from the substrate. Once the probes are detached, it is very difficult to TAB bond new probes in the same location because of the contamination and peeling of gold that remains from the original bond.

BRIEF DESCRIPTION OF THE DRAWINGS

In the figures of the accompanying drawings like reference numerals refer to similar elements.

FIG. 1 is a flow diagram that depicts a method for fabricating a probe for a probe card assembly user laser welding, according to one embodiment of the invention.

FIG. 2 depicts an example beam panel that includes a plurality of beam elements attached to a strip.

DETAILED DESCRIPTION

Figure 3:
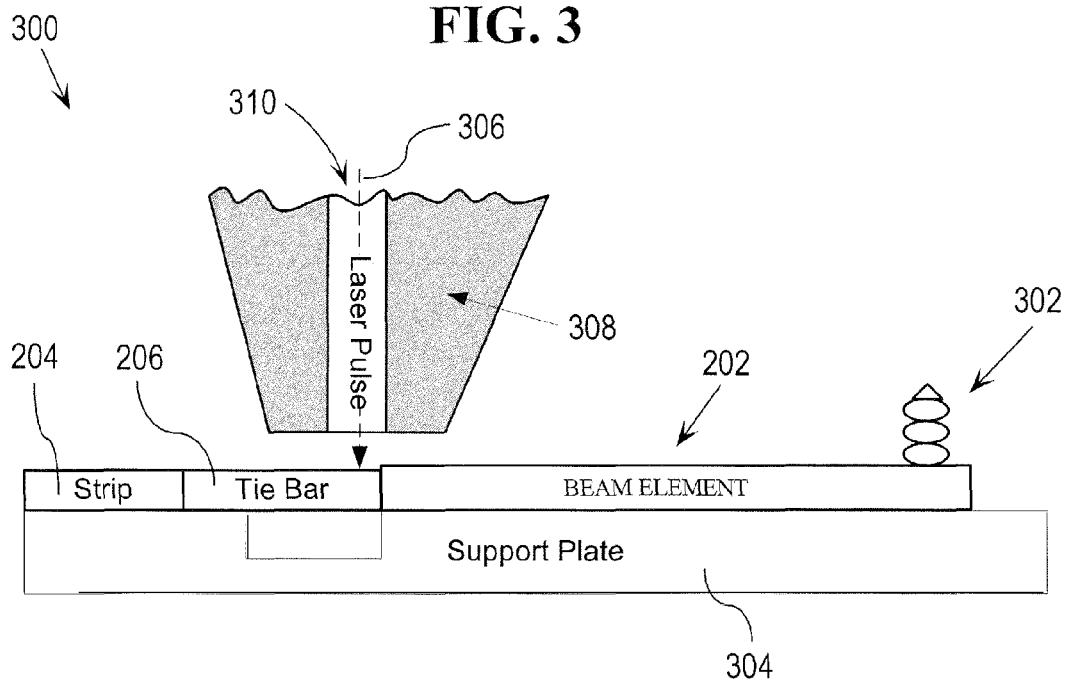
FIG. 3 depicts a side view of an arrangement for cutting a beam element from a beam panel using a laser, according to one embodiment of the invention.

An approach is provided for assembling and repairing probe assemblies using laser welding. The approach generally includes aligning a beam element to a post element on a probe substrate. The beam element is positioned in contact with the post element on the probe substrate. The beam element is then attached to the post element on the probe substrate by laser welding the beam element to the post element on the probe substrate. As described in more detail hereinafter, the approach may include the use of a vacuum capillary pickup tool to align and position the beam element. Other mechanisms may be used to assist with the alignment of the beam element to the post element, such as machine vision cameras. The vacuum capillary pickup tool may operate in conjunction with a laser beam delivery system for guiding the laser beam to the correct location for welding and also to assist in removing gases and debris attributable to the laser welding process. The laser may also be used to remove the beam element from a beam panel. The approach allows probe elements to be connected directly to a probe substrate with a high strength bond that does not require an intermediate layer. This is helpful when probes need to be repaired because there is no contamination from intermediate layer materials when a probe is adjusted or replaced. The approach may be fully automated and therefore can be much faster and more cost effective than conventional approaches. Further, the approach may be used with any type of probe, for example, vertical and cantilever probes.

FIG. 1 is a flow diagram 100 that depicts a method for fabricating a probe for a probe card assembly using laser welding, according to one embodiment of the invention. Not all of the steps depicted in FIG. 1 and described hereinafter are required and the steps may be performed in different order, depending upon a particular implementation. Additional steps may also be performed in some implementations. The steps depicted in FIG. 1 are described in conjunction with other figures described hereinafter.

In step 102, a beam element is removed from a beam panel. The beam element may be removed from the beam panel using a wide variety of techniques, for example, by cutting or sawing. According to one embodiment of the invention, the beam element is cut from the beam panel using a laser. FIG. 2 depicts an example beam panel 200 that includes a plurality of beam elements 202 attached to a strip 204. A beam element 202 is removed from the beam panel 200 at a tie bar 206, which is sometimes referred to as a "tail tie bar." As depicted in FIG. 2, the tie bars 206 may have a tapered shape, but the approach is applicable to tie bars of any shape or beam elements 202 without tie bars.

FIG. 3 depicts a side view of an arrangement for cutting a beam element from a beam panel using a laser, according to one embodiment of the invention. A beam element 202 is connected to the strip 204 via tie bar 206 and includes a stacked tip 302 for making contact with a device under test. Beam element 202 is supported by a support plate 304, which may, for example, support the entire beam panel 200. Beam element 202 is cut from strip 204 using a laser pulse, as indicated by line 306. Any type of laser mechanism may be used for cutting probe elements from a strip 204 and the type of laser mechanism may vary, depending upon a particular implementation. For example, the laser wavelength, pulse duration and/or total time, power and other parameters may be selected based upon the material composition of tie bar 206, as well as the size and thickness of tie bar 206. One example laser is an SPI diode laser, CW 200 W power, 1075 nm wavelength. According to one embodiment of the invention, the laser cutting is performed in conjunction with the use of a vacuum capillary pickup tool 308. The vacuum capillary pickup tool 308 includes an aperture 310, though which a vacuum is applied to the top surface of the tie bar 206. This provides for the capture and removal of gasses and debris created by the cutting of the beam element 202 at the tie bar 206. The vacuum capillary pickup tool 308 may also be used to guide the laser beam to the correct location for cutting.

Figure 4:
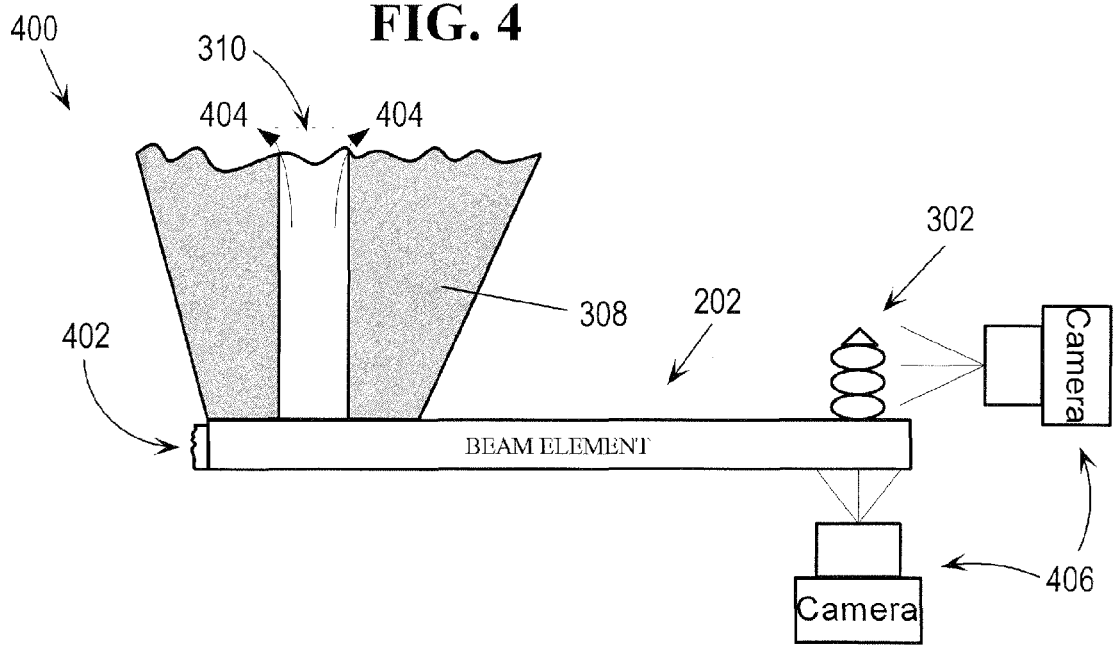
FIG. 4 depicts an arrangement for removing and aligning a beam element that has been removed from a strip using laser cutting.

In step 104, the beam element is aligned and positioned on a post element on a probe substrate. FIG. 4 depicts an arrangement 400 for removing and aligning beam element 202 after it has been removed from strip 204 (FIG. 3) using laser cutting. As depicted in FIG. 4, all that remains of tie bar 206 after laser cutting is a remaining portion 402. According to one embodiment of the invention, the vacuum capillary pickup tool 308 is used to pick up and place the beam element 202 on a corresponding post element for attachment. As indicated by reference numeral 404, vacuum capillary pickup tool 308 creates a vacuum in aperture 310 so that beam element 202 can be picked up and positioned when vacuum capillary pickup tool 308 is in contact with beam element 202. As depicted in FIG. 4, one or more machine vision cameras 406 may be used to align and position (X, Y and rotation offset) beam element 202 onto a corresponding post element. The machine vision cameras 406 may align beam element 202 based upon stacked tip 302, or any other feature of beam element 202.

Figure 5:
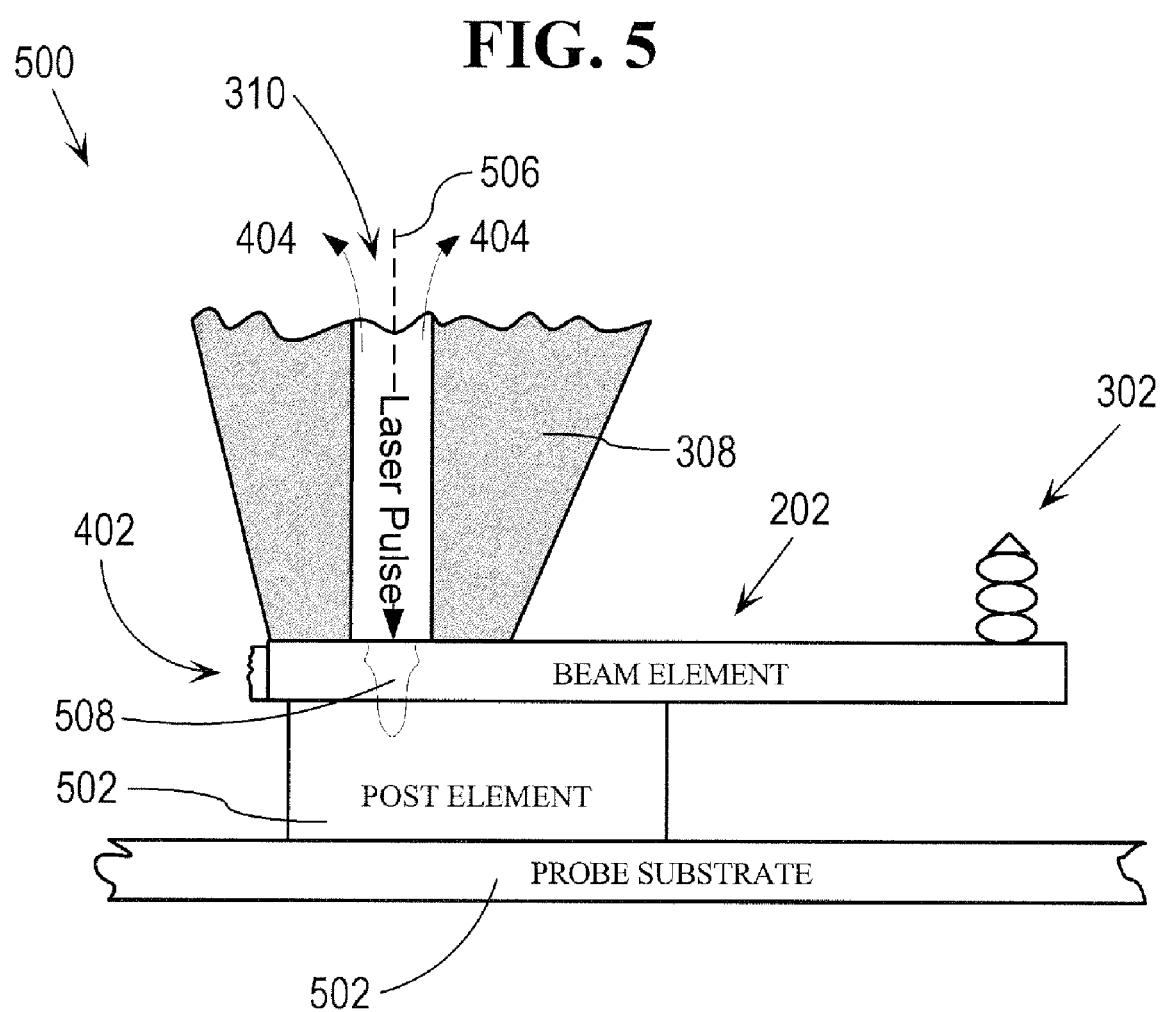
FIG. 5 depicts an arrangement where a vacuum capillary pickup tool is used to align and position a beam element onto a post element on a probe substrate, according to an embodiment of the invention

FIG. 5 depicts an arrangement 500 where the vacuum capillary pickup tool 308 is used to align and position the beam element 202 onto a post element 502 on a probe substrate 504, according to one embodiment of the invention. The vacuum capillary pickup tool 308 may also be used to exert a downward force on beam element 202 and ensure a tight fit between beam element 202 and post element 502.

Figure 6:
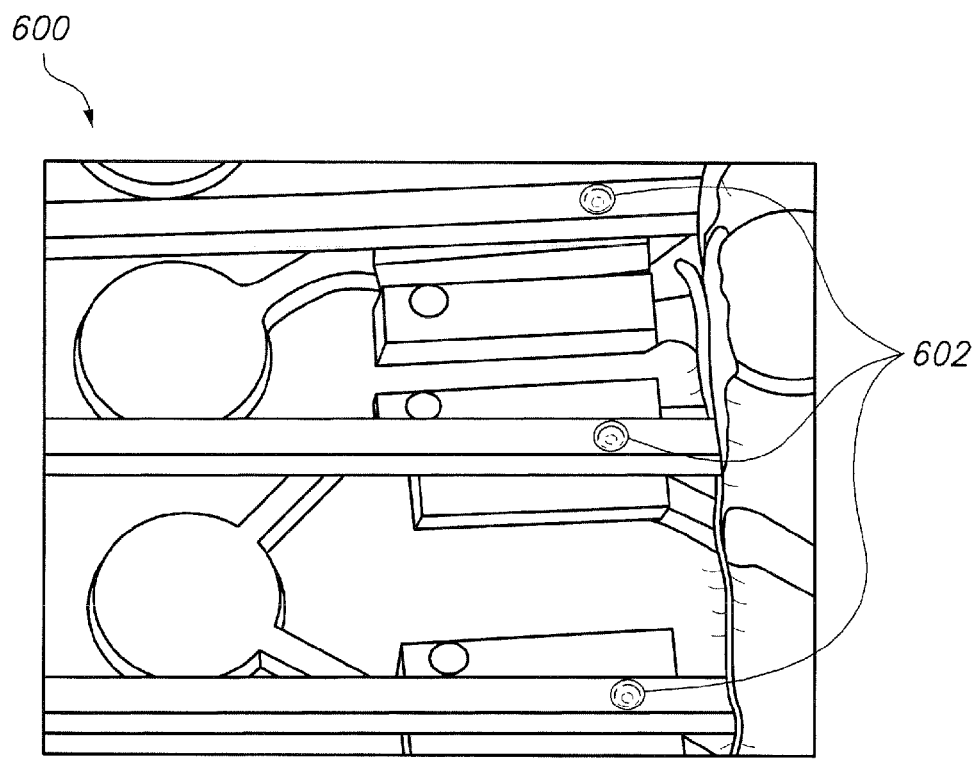
FIG. 6 depicts a top magnified view of bonds created when beam elements are bonded to underlying post elements using a laser in accordance with an embodiment of the invention.
Figure 7:
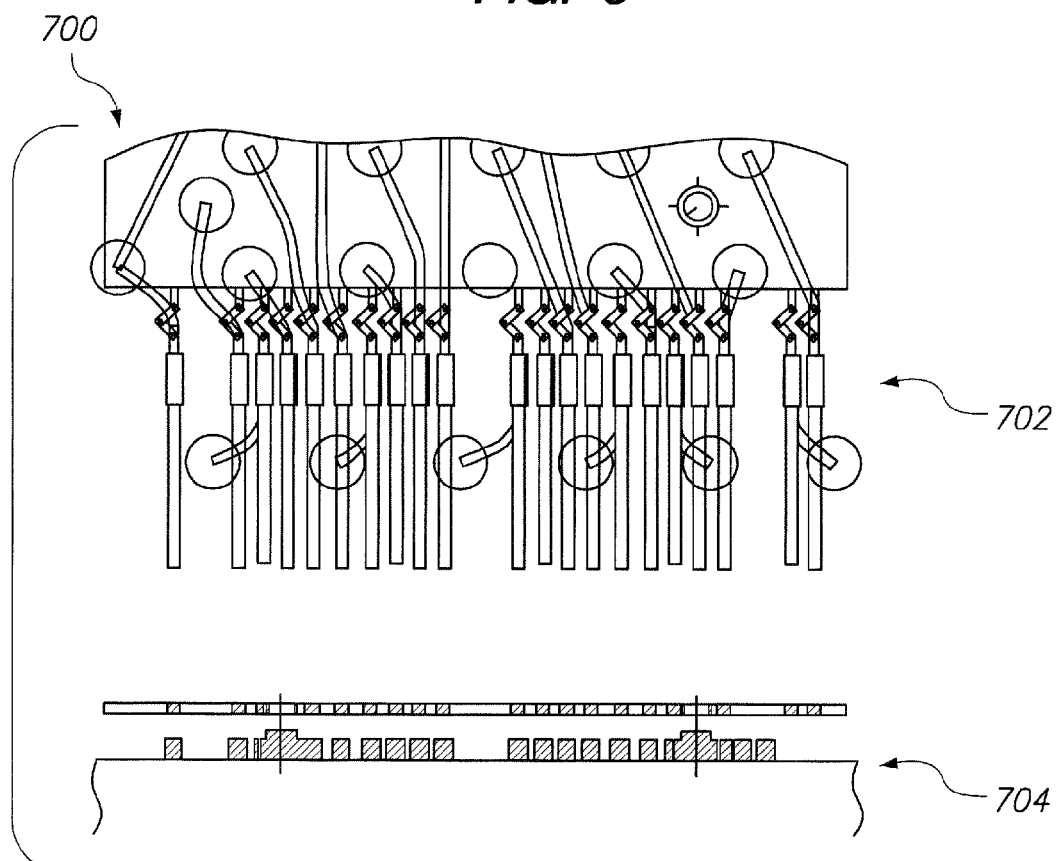
FIG. 7 depicts a scanning electron microscope (SEM) micrograph of a set of beam elements bonded to corresponding posts using laser welding, according to an embodiment of the invention.

In step 106, the beam element is attached to the post element on the probe substrate. As depicted in FIG. 5, a laser pulse (indicated by reference numeral 506) is applied to beam element 202 through aperture 310 of the vacuum capillary pickup tool 308. The particular parameters used to laser weld the beam element 202 to the post element 502 may vary depending upon a particular implementation and the parameters may not be the same as those used to laser cut tie bar 206, since tie bar 206 may have different characteristics (size, shape, thickness, material, etc.) than the portion of the beam element 202 where the laser weld is created. For example, the laser wavelength, pulse duration and/or total time, power and other parameters may be selected based upon the material composition of beam element 202, as well as the size and thickness of beam element 202. One non-limiting example set of parameters is a wavelength of 1075 nm, a pulse width of 20~500 ms, power of 20~40 W and focused using a 50 mm focal length convex lens to create a spot size of 50~100 □m. The application of the laser pulse 506 to the beam element 202 creates a bond or weld 508 that connects beam element 202 to post element 502. The vacuum capillary pickup tool 308 may also be used to guide the laser beam to the correct location for laser welding. As depicted in FIG. 5, the bond 508 extends completely through beam element 202 and into post element 502. The size and shape of the bond 508 may vary, depending upon the particular materials of beam element 202 and the particular parameters used for the laser welding. For example, the pulse may be changed from a top hat profile to having a very high initial intensity for melting the top gold layer to having a gradual tapered tail for improved weld strength. The weld spot size may also be changed to suit a particular implementation. The process of forming the bond 508 using a laser may cause a melting of a portion of the beam element 202. The vacuum capillary pickup tool 308 removes gasses and debris created by the use of the laser pulse 506 to bond the beam element 202 to the post element 502. FIG. 6 depicts a top magnified view 600 of the bonds 602 created when beam elements are bonded to underlying post elements using a laser in accordance with an embodiment of the invention. FIG. 7 depicts a scanning electron microscope (SEM) micrograph 700 of a set of beam elements bonded to corresponding posts using laser welding, according to one embodiment of the invention. The micrograph 700 includes a top view 702 and a side view 704.

Although the invention is depicted and described herein with reference to specific embodiments, the invention is not intended to be limited to the details shown. Rather, various modifications may be made in the details within the scope and range of equivalents of the claims and without departing from the invention.

What is claimed is:

1. A method for fabricating a probe for a probe card assembly, the method comprising:
   removing a beam element from a beam panel by laser cutting the beam element from the beam panel by operating a vacuum capillary pickup tool in conjunction with the laser cutting of the beam element to align the laser and to remove gases and debris created by the laser cutting;
   using the vacuum capillary pickup tool to align the beam element to a post element on a probe substrate;
   using the vacuum capillary pickup tool to position the beam element in contact with the post element on the probe substrate and to align the laser with the beam element; and
   attaching the beam element to the post element on the probe substrate by laser welding the beam element to the post element on the probe substrate, wherein the laser welding of the beam element to the post element forms a bond that extends completely through the beam element and into the post element and wherein the vacuum capillary pickup tool removes gases and debris created by the laser welding,
   wherein the using the vacuum capillary pickup tool in conjunction with the laser welding to align the laser with the beam element and to remove gases and debris created by the laser welding includes transmitting a laser pulse through an aperture in the vacuum capillary pickup tool and providing a vacuum to remove the gases and debris through the aperture,
   wherein the steps of aligning, positioning, and attaching are performed using the vacuum capillary pickup tool in conjunction with a laser, and
   wherein the vacuum capillary tool and the laser are substantially perpendicular to the probe substrate.

2. The method as recited in claim 1, wherein the laser cutting the beam element from the beam panel includes laser cutting a tie bar that holds the beam element to the beam panel.

3. The method as recited in claim 2, wherein the laser cutting the tie bar that holds the beam element to the beam panel includes operating the vacuum capillary pickup tool in conjunction with the laser cutting of the tie bar to align the laser with the tie bar and to remove gases and debris created by the laser cutting and welding.

4. The method as recited in claim 1, wherein the using the vacuum capillary pickup tool to position the beam element in contact with the post element includes using the vacuum capillary pickup tool to exert downward pressure on the beam element in contact with the post element and to reduce any gaps between the beam element and the post element.

5. The method as recited in claim 1, wherein the attaching the beam element to the post element on the probe substrate by laser welding the beam element to the post element includes attaching the beam element to the post element on the probe substrate by laser welding the beam element directly to the post element without any intermediate materials between the beam element and the post element.

6. The method as recited in claim 1, wherein the laser welding of the beam element to the post element causes melting of at least a portion of the beam element.

* * * * *